United States Patent
Ohashi

Patent Number: 5,821,845
Date of Patent: Oct. 13, 1998

[54] ELECTROMAGNETIC NOISE ABSORBER

[75] Inventor: Yoshinori Ohashi, Nagoya, Japan

[73] Assignee: Kitigawa Industries Co., Ltd., Nagoya, Japan

[21] Appl. No.: 903,263

[22] Filed: Jul. 25, 1997

[51] Int. Cl.$^6$ ............ H01F 27/02; H01F 17/06; H01P 5/00
[52] U.S. Cl. ............ 336/92; 336/90; 336/175; 336/176; 336/178; 333/1; 333/12
[58] Field of Search ............ 336/90, 92, 175, 336/176, 178, 210; 333/1, 12

[56] References Cited

U.S. PATENT DOCUMENTS

| | | | |
|---|---|---|---|
| D. 308,017 | 5/1990 | Fujioka | D8/396 |
| D. 310,020 | 8/1990 | Fujioka | D8/396 |
| 4,825,185 | 4/1989 | Matsui | 336/212 |
| 4,851,803 | 7/1989 | Hahn | 336/176 |
| 4,873,505 | 10/1989 | Matsui | 336/92 |
| 4,885,559 | 12/1989 | Nakano | 336/92 |
| 4,964,012 | 10/1990 | Kitagawa | 361/92 |
| 4,983,932 | 1/1991 | Kitagawa | 333/12 |
| 5,264,814 | 11/1993 | Yamazaki et al. | 336/65 |
| 5,343,184 | 8/1994 | Kitagawa | 336/92 |

FOREIGN PATENT DOCUMENTS

| | | |
|---|---|---|
| 2224394 | 5/1990 | United Kingdom . |
| 2233159 | 1/1991 | United Kingdom . |
| 2284102 | 5/1995 | United Kingdom . |

*Primary Examiner*—Michael L. Gellner
*Assistant Examiner*—Anh Mai
*Attorney, Agent, or Firm*—Davis and Bujold

[57] ABSTRACT

Proposed is a reduction of variance in electromagnetic noise eliminating effect with signal conductors arranged in a flat cable to which an electromagnetic noise absorber is attached. The electromagnetic noise absorber is provided with a plate magnetic body and a U-shaped magnetic body. Since the width of the plate magnetic body is smaller than the interval between the side walls of the U-shaped magnetic body, the plate magnetic body can be accommodated in the U-shaped magnetic body, with a clearance formed between the end portions of the plate magnetic body and the side walls of the U-shaped magnetic body. The impedance in the vicinity of the clearance is decreased, and the difference in impedance between the end portions and the middle portion of the electromagnetic noise absorber is decreased. Therefore, a variance in the electromagnetic noise eliminating effect with signal conductors of the flat cable is made small.

19 Claims, 12 Drawing Sheets

ELECTROMAGNETIC NOISE ABSORBER

BACKGROUND OF THE INVENTION

This invention relates to electromagnetic noise absorbers.

Conventionally, an electromagnetic noise absorber is attached to the outer periphery of a flat cable, a Flexible Printed Circuit (FPC) cable or other flat body with a plurality of signal conductors juxtaposed therein. For example, an annular electromagnetic noise absorber 201 shown in FIG. 11A is formed corresponding to the outer configuration of the flat cable, and an annular electromagnetic noise absorber 203 shown in FIG. 11B is composed of a pair of divided parts 203a, 203b.

In these electromagnetic noise absorbers 201 and 203, there is a difference in the distribution of a magnetic body per each signal conductor of the flat cable between middle portions 209, 211 and end portions 205, 207. A relatively large amount of magnetic body is distributed in the vicinity of the end portions 205 and 207. Therefore, as shown in FIG. 12, the impedance of the flat cable with the electromagnetic noise absorber attached varies with electric wire positions. A shortcoming associated with this arrangement is that the electric noise absorbing or eliminating effect varies with electric wires or signal conductors of the flat cable to which the electromagnetic noise absorber is attached.

SUMMARY OF THE INVENTION

Wherefore, an object of the present invention is to provide an electromagnetic noise absorber whose variance in noise eliminating effect with signal conductors can be controlled.

To attain this and other objects, the present invention provides an electromagnetic noise absorber with a first magnetic body composed of a first plate member and a second magnetic body composed of a second plate member. The electromagnetic noise absorber is attached on the outer periphery of a flat cable with a plurality of signal conductors juxtaposed therein. A pair of side walls are projected from the end portions of either one of the first and second plate members toward the opposing plate member. The side walls can be provided on either one end portion of the first and second plate members or on both end portions of the first or second plate member.

When each of the first and second plate members has one side wall on its end portion, both the first and second magnetic bodies have an L-shaped cross section. When two side walls are provided on both end portions of the first or second plate member, one of the magnetic bodies has a U-shaped cross section, while the other magnetic body has a plate-like cross section.

The first and second magnetic bodies are attached to the outer periphery of the flat cable, with the first plate member opposed to one face of the flat cable and the second plate member opposed to the other face of the flat cable. A clearance is maintained between the end portion having no side wall of either one of the first or second plate member and the opposed side wall.

In the presence of such clearance, impedance is decreased in the wires in the vicinity of the end portions of the plate members, i.e. in the signal conductors arranged on both ends of the flat cable. A difference in impedance between the end portions and the middle portion of the flat cable is reduced. Therefore, any variance in electromagnetic noise eliminating effect with the signal conductors juxtaposed in the middle and the end portions of the flat cable is made small.

The clearances, formed in two positions, are preferably the same size.

When the electromagnetic noise absorber is attached to the flat cable, the spacing members are provided between the end portions having no side walls and the side walls, for maintaining the clearance therebetween easily and appropriately.

The spacing member can be formed of sponge, rubber, felt, cork or other elastic material, plastic material, or electrical insulating material. Alternatively, part of the member for connecting the first and second magnetic bodies can serve as the spacing member.

BRIEF EXPLANATION OF DRAWING FIGURES

DETAILED DESCRIPTION OF PREFERRED EMBODIMENTS

First Embodiment

Figure 1A:
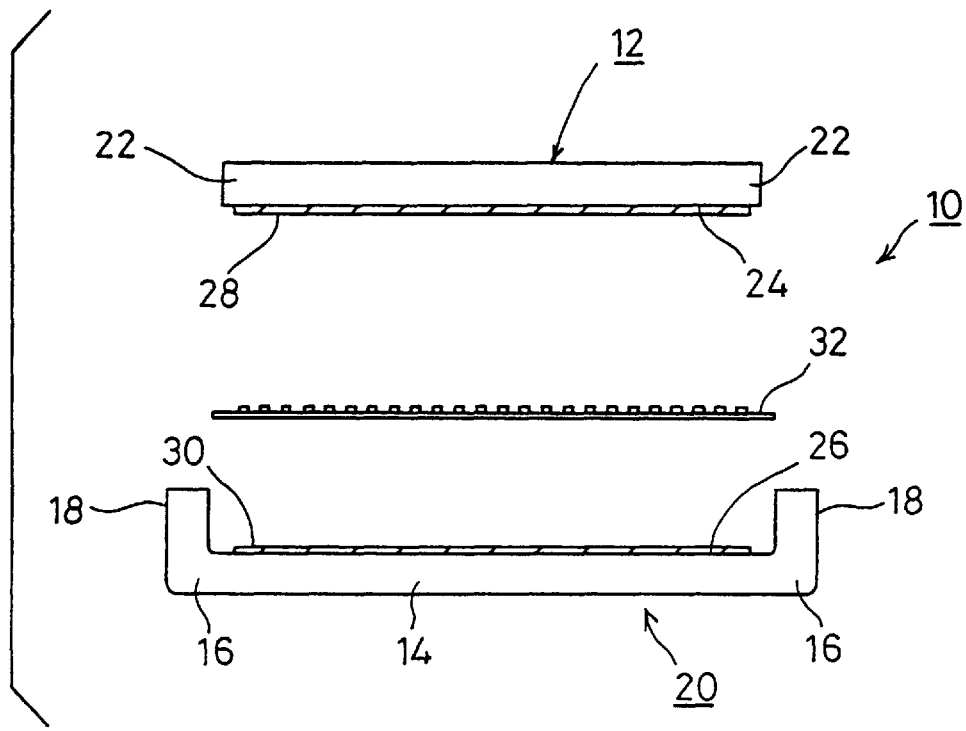
FIG. 1A is an exploded view of an electromagnetic noise absorber embodying the present invention.
Figure 1B:
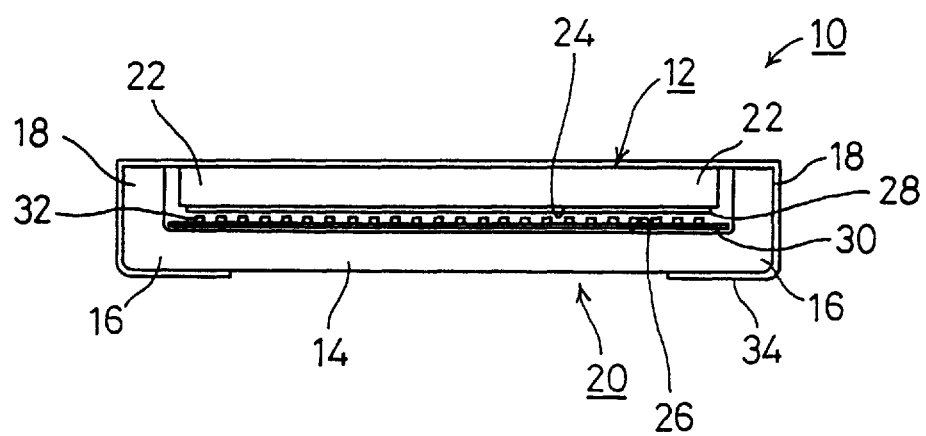
FIG. 1B is a sectional view of the electromagnetic noise absorber attached around an FPC cable according to the first embodiment.

In the first embodiment shown in FIGS. 1A and 1B, an electromagnetic noise absorber 10 is provided with a plate magnetic body 12 and a U-shaped magnetic body 20 having a U-shaped cross section, both bodies being formed of ferrite. The U-shaped magnetic body 20 is composed of a flat portion 14 having end portions 16, from which a pair of side walls 18 project substantially vertically. Adhesive layers or adhesive double coated tapes 28 and 30 are provided on an underside 24 of plate magnetic body 12 and a flat inner face 26 of U-shaped magnetic body 20, respectively.

As clearly shown in FIG. 1B, the width of the plate magnetic body 12 is smaller than the interval between the side walls 18 of the U-shaped magnetic body 20, such that the plate magnetic body 12 can be accommodated in the U-shaped magnetic body 20. When the plate magnetic body 12 is assembled in the U-shaped magnetic body 20, end portions 22 of plate magnetic body 12 are disposed with a clearance between the end portions 22 and the side walls 18 of the U-shaped-magnetic body 20.

The electromagnetic noise absorber 10 having the aforementioned structure is attached surrounding the outer periphery of an FPC cable 32. The FPC cable 32 is fixed to the plate magnetic body 12 and the U-shaped magnetic body 20. In this embodiment, the FPC cable 32 is first fixed to the U-shaped magnetic body 20 via the adhesive double coated tape 30. Subsequently, the plate magnetic body 12 is dropped or placed on the FPC cable 32, so that the plate magnetic body 12 is disposed within the U-shaped magnetic body 20 and is, simultaneously, firmly attached via the adhesive double coated tape 28 to the FPC cable 32. In this case, a clearance is required between the end portions 22 of the plate magnetic body 12 and the side walls 18 of the U-shaped magnetic body 20.

Consequently, the plate magnetic body 12 is interconnected with the U-shaped magnetic body 20 via the FPC cable 32, and the electromagnetic noise absorber 10 is attached around the FPC cable 32.

To further secure the attachment, an adhesive tape 34 formed of vinyl chloride is wound around the outer periphery of the U-shaped magnetic body 20 assembled with the plate magnetic body 12. When the plate magnetic body 12 and the U-shaped magnetic body 20 are thus firmly interconnected, the electromagnetic noise absorber 10 is prevented from being dislocated or detached from the FPC cable 32.

Impedance of the electric wires with the electromagnetic noise absorber attached was measured as follows:

(1) measuring apparatus: Network/Spectrum Analyzer YHP-4195A manufactured by Hewlett-Packard Japan Ltd.
(2) electric wire used in measurement: BAN-CARD UL-Style No. 2896 manufactured by BANDO DENSEN CO., Ltd. The length of the electric wire was 35 mm.
(3) measuring procedure:
  a) FPC cable 32 was placed in the channel part of the U-shaped magnetic body 20 with the plate magnetic body 10 placed thereon, thereby putting the FPC cable 32 between magnetic materials. In addition, the adhesive tape 34 was used to form the electromagnetic noise absorber 10 shown in FIG. 1B.
  b) Both ends of one of the plurality of measuring electric wires in the FPC cable 32 were connected with a measuring terminal of the measuring apparatus.
  c) The measuring apparatus was operated, and impedance was measured and recorded in the measuring frequencies of 25 MHz and 100 MHz.
  d) Impedance was measured for all the measuring electric wires. Then, a graph was drawn up in which electric wire positions were shown by the axis of abscissa and impedance by the axis of ordinate. The electric wire positions corresponded to the numbers of their arrangement which went from one end to the other end of the FPC cable 32 in the cross direction.

Figure 2:
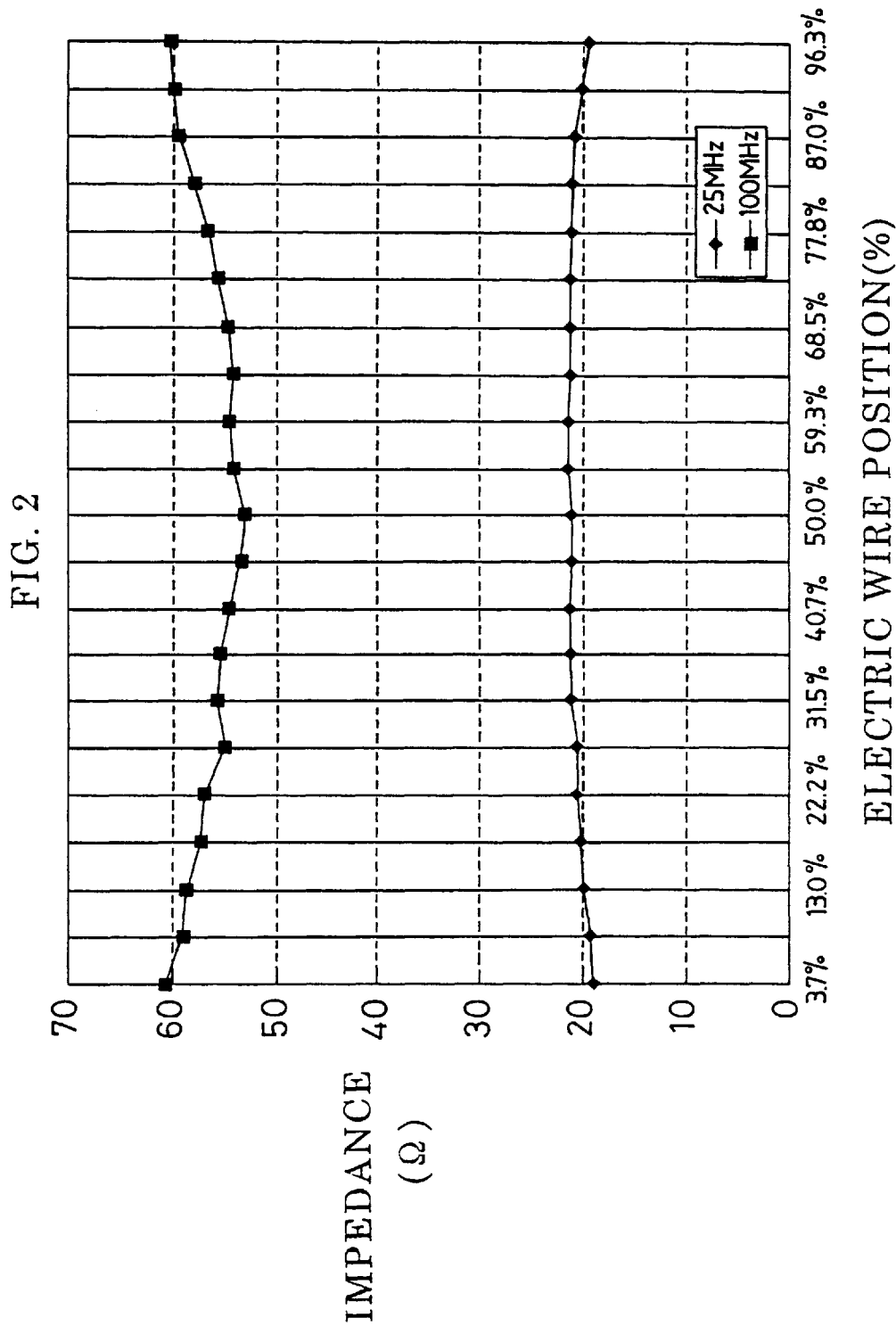
FIG. 2 is a graph showing the characteristic of impedance with electric wire positions, of the flat cable with the electromagnetic noise absorber attached according to the first embodiment.

The graph which was made as aforementioned is shown in FIG. 2. For the impedance to an electric current of 25 MHz, the maximum value is 21.4 Ω at an electric wire position 59.3%, the minimum value is 19.0 Ω at a position 3.7%, and the rate of the minimum value to the maximum value is 0.89. For the impedance to an electric current of 100 MHz, the maximum value is 60.7 Ω at an electric wire position 3.7%, the minimum value is 53.1 Ω at a position 50.0%, and the rate of the minimum value to the maximum value is 0.88.

Figure 12:
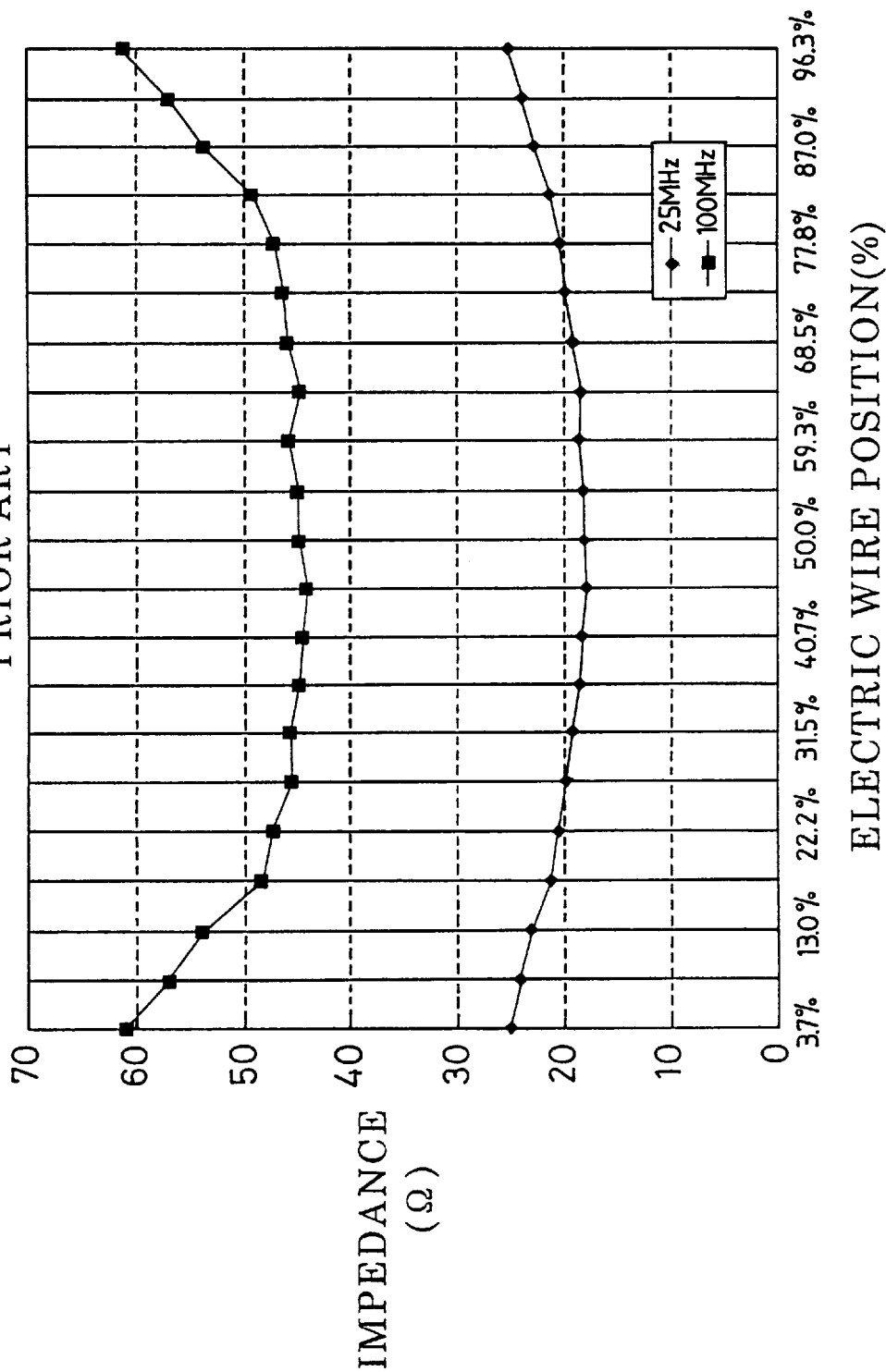
FIG. 12 is a graph showing the characteristic of impedance with electric wire positions, of the flat cable with the prior-art electromagnetic noise absorber, shown in FIG. 11A, attached.

In contrast, the characteristic of impedance of the flat cable with the prior-art electromagnetic noise absorber attached is shown in FIG. 12. For the impedance to an electric current of 25 MHz, the maximum value is 25.4 Ω at an electric wire position 96.3%, the minimum value is 18.1 Ω at a position 45.4%, and the rate of the minimum value to the maximum value is 0.71. For the impedance to an electric current of 100 MHz, the maximum value is 61.4 Ω at an electric wire position 96.3%, the minimum value is 44.4 Ω at a position 45.4%, and the rate of the minimum value to the maximum value is 0.72.

FIG. 2 clearly shows, relative to FIG. 12, that the electromagnetic noise absorber 10 of the present invention has only a small difference in impedance between its middle portion and its end portions, and only a small difference in electromagnetic noise eliminating effect among the electric wires or signal conductors of the FPC cable 32.

Examples of attachments of electromagnetic noise absorbers 10 are now explained.

First Example

Figure 3:
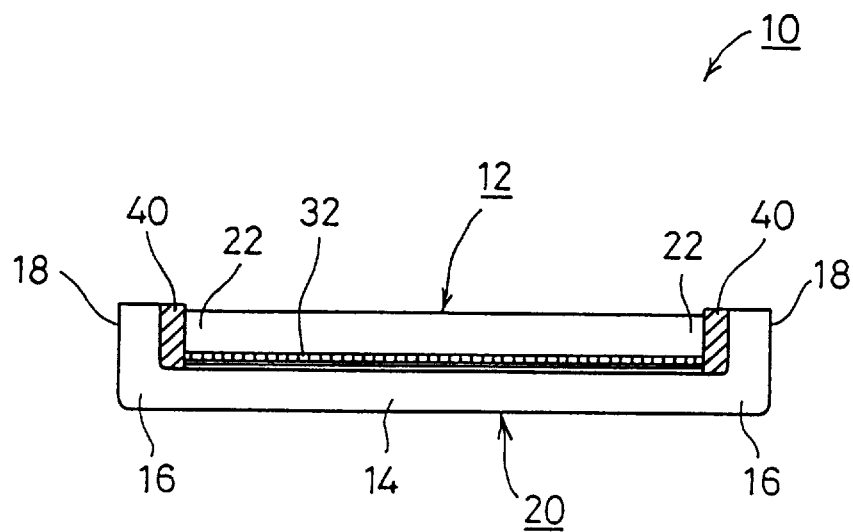
FIG. 3 is a sectional view showing a first example of attachment of the electromagnetic noise absorber.

In the example shown in FIG. 3, adhesive double coated tapes are interposed between the plate magnetic body 12 and the FPC cable 32 and between the FPC cable 32 and the U-shaped magnetic body 20, respectively, thereby interconnecting these three components. A pair of spacers 40 are inserted between the end portions 22 of the plate magnetic body 12 and the side walls 18 of the U-shaped magnetic body 20, so that an interval can be made therebetween. Since the spacers 40 have substantially the same thickness, the left interval as viewed in the figure between the end portion 22 of the plate magnetic body 12 and the side wall 18 of the U-shaped magnetic body 20 is substantially the same as the corresponding right interval. The spacers 40 are formed of sponge, rubber, felt, cork or other elastic material, plastic material, or electrical insulating material.

Further, in the same manner as shown in FIG. 1B, the adhesive tape 34 can be wound around the outer periphery of the assembled electromagnetic noise absorber 10, so that the plate magnetic body 12 and the U-shaped magnetic body 20 can be firmly interconnected and the electromagnetic noise absorber 10 can be prevented from being dislocated or detached.

Second Example

Figure 4:
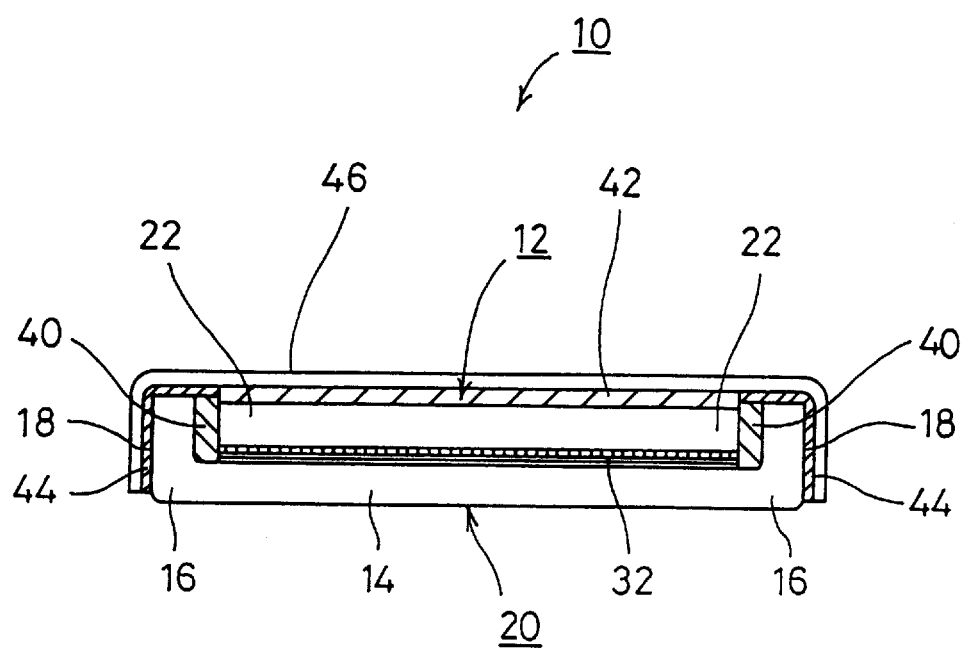
FIG. 4 is a sectional view showing a second example of attachment of the electromagnetic noise absorber.

In the example shown in FIG. 4, adhesive double coated tapes are placed between the plate magnetic body 12 and the FPC cable 32 and between the FPC cable 32 and the U-shaped magnetic body 20, respectively, thereby interconnecting these three components. The spacers 40 are inserted between the end portions 22 of the plate magnetic body 12 and the side walls 18 of the U-shaped magnetic body 20, in the same manner as in the first example shown in FIG. 1B.

Additionally, an adhesive double coated tape 42 with sponge attached thereto is placed on the outer surface of the plate magnetic body 12, while the side walls 18 of the U-shaped magnetic body 20 and the spacers 40 are covered with adhesive double coated tapes 44. Finally, the adhesive double coated tape with sponge 42 and the adhesive double coated tapes 44 are covered with a sheet 46 of vinyl chloride.

In this example the relative positioning of the plate magnetic body 12 and the U-shaped magnetic body 20 can be secured via the sheet 46. Therefore, the relative position of the FPC cable 32, the plate magnetic body 12 and the U-shaped magnetic body 20 can be advantageously prevented from varying.

Third Example

Figure 5:
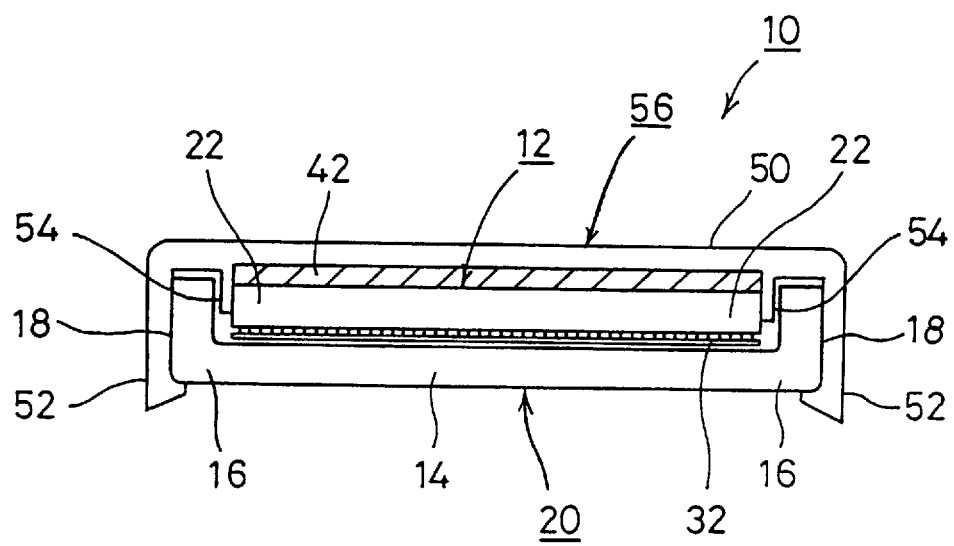
FIG. 5 is a sectional view showing a third example of attachment of the electromagnetic noise absorber.

In the example shown in FIG. 5, a fixing member 56 is provided with a pair of locking projections 52 formed on both ends of a back plate 50 and a pair of holding projections 54. The interval between the holding projections 54 corresponds to the width of the plate magnetic body 12.

In attachment, the back plate 50 of the fixing member 56 is interconnected with the plate magnetic body 12 via the adhesive double coated tape with sponge 42. The locking projections 52 are engaged with the end portions 16 of the U-shaped magnetic body 20, with the FPC cable 32 inserted between the plate magnetic body 12 and the U-shaped magnetic body 20. The electromagnetic noise absorber 10 is thus attached around the FPC cable 32.

Each clearance between the end portions 22 of the plate magnetic body 12 and the side walls 18 of the U-shaped magnetic body 20 is formed by each of the holding projections 54. The locking projections 52 are securely locked by means of the elasticity of the adhesive double coated tape with sponge 42 and the back plate 50. When the left interval between the locking projection 52 and the holding projection 54 is substantially the same as the right interval, the left clearance between the side wall of the U-shaped magnetic body 20 and the end portion 22 of the plate magnetic body 12 is substantially the same as the right clearance.

Additionally, the adhesive double coated tapes can be interposed between the plate magnetic body 12 and the FPC cable 32 and between the FPC cable 32 and the U-shaped magnetic body 20 in the same manner as shown in FIG. 1B.

Fourth Example

Figure 6:
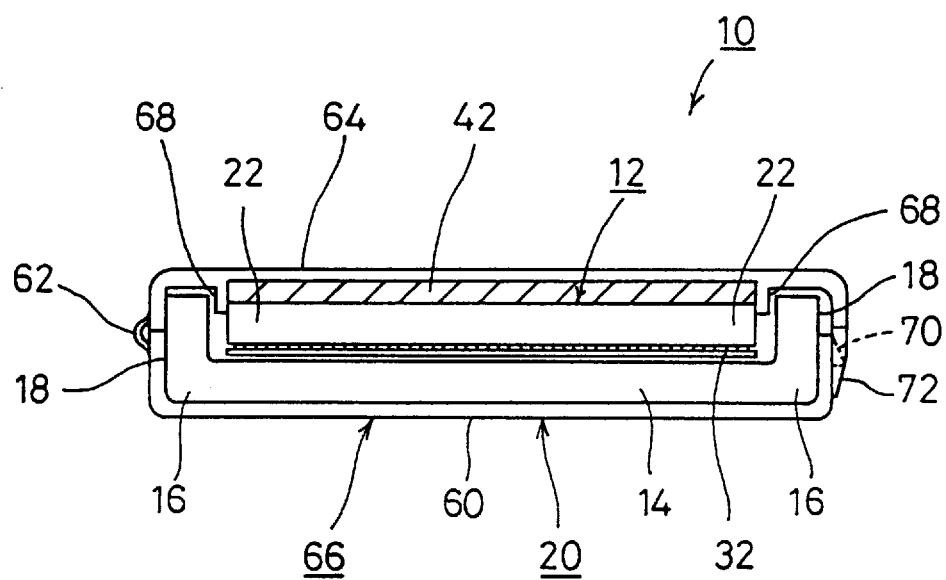
FIG. 6 is a sectional view showing a fourth example of attachment of the electromagnetic noise absorber.

In the example shown in FIG. 6 a box-shaped fixing member 66 is composed of a case member 60 for accommodating the U-shaped magnetic body 20 and a lid member 64 pivotably connected via a hinge 62 to the case member 60. A pair of holding projections 68 are formed on the inner face of the lid member 64. The interval between the holding projections 68 corresponds to the width of the plate magnetic body 12. A locking portion 72 is formed at the side opposite to the hinge 62 of the lid member 64 and is disengageably engaged with a projection 70 formed on the case member 60.

In attachment, as shown in FIG. 6, the lid member 64 is attached to the plate magnetic body 12 with the adhesive double coated tape with sponge 42 placed between the holding projections 68 of the lid member 64. The locking portion 72 is engaged with the projection 70, with the FPC cable 32 inserted between the U-shaped magnetic body 20 disposed within the case member 60 and the plate magnetic body 12 attached on the lid member 64, thereby closing the box-shaped fixing member 66. The electromagnetic noise absorber 10 is thus attached around the FPC cable 32.

Each clearance between the end portions 22 and the side walls 18 is kept by each of the holding projections 68. Substantially the same clearance can be made between the U-shaped magnetic body 20 and the plate magnetic body 12 in both ends of the electromagnetic noise absorber 10, by appropriately positioning the holding projections 68.

In the same manner as shown in FIG. 1B, adhesive double coated tapes can be interposed between the plate magnetic body 12 and the FPC cable 32 and between the FPC cable 32 and the U-shaped magnetic body 20, respectively.

Fifth Example

Figure 7:
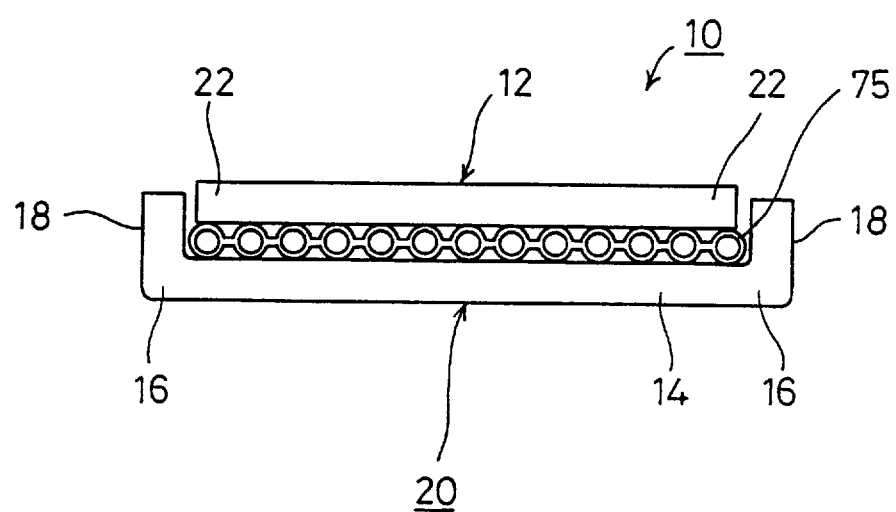
FIG. 7 is a sectional view showing a fifth example of attachment of the electromagnetic noise absorber.

In the example shown in FIG. 7, the electromagnetic noise absorber 10 is attached around a flat cable 75, thicker than the FPC cable 32.

As shown in FIG. 7, the thickness of the flat cable 75 forms a stepped upper surface of the electromagnetic noise absorber 10. Specifically, the end portions 22 of the plate magnetic body 12 are slightly higher than the side walls 18 of the U-shaped magnetic body 20. However, the electromagnetic noise absorber 10 can be attached around the flat cable 75 without problem, by interposing adhesive double coated tapes between the plate magnetic body 12 and the flat cable 75 and between the flat cable 75 and the U-shaped magnetic body 20 in the same manner as shown in FIG. 1B.

Additionally, the outer periphery of the electromagnetic noise absorber can be wrapped with an adhesive tape to provide better support as shown in FIG. 1B.

Alternatively, after an adhesive double coated tape with sponge is placed on the outer periphery of each side wall 18 and its vicinity, and an adhesive double coated tape is placed on the outer periphery of the plate magnetic body 12, a sheet of vinyl chloride can be wound around the outer periphery of the assembled electromagnetic noise absorber 10, in the same manner as shown in FIG. 4.

Since the electromagnetic noise absorber 10 is divided into the plate magnetic body 12 covering one face of the flat cable 75 and the U-shaped magnetic body 20 covering the other face of the flat cable 75, the attachment of the electromagnetic noise absorber 10 can be adjusted corresponding to the thickness of the flat cable 75.

SECOND EMBODIMENT

The second embodiment is characterized by a pair of fixing members.

Figure 8A:
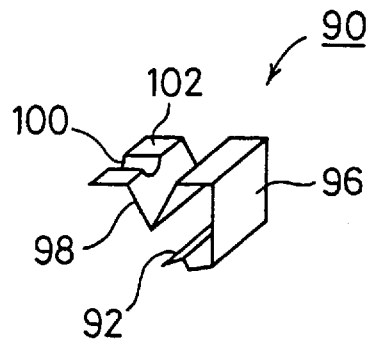
FIG. 8A is a perspective view of a fixing member of an electromagnetic noise absorber according to the second embodiment.
Figure 8B:
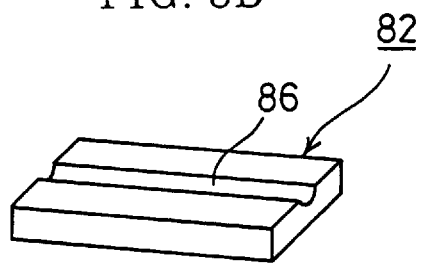
FIG. 8B is a perspective view of a plate magnetic body forming the electromagnetic noise absorber.
Figure 8C:
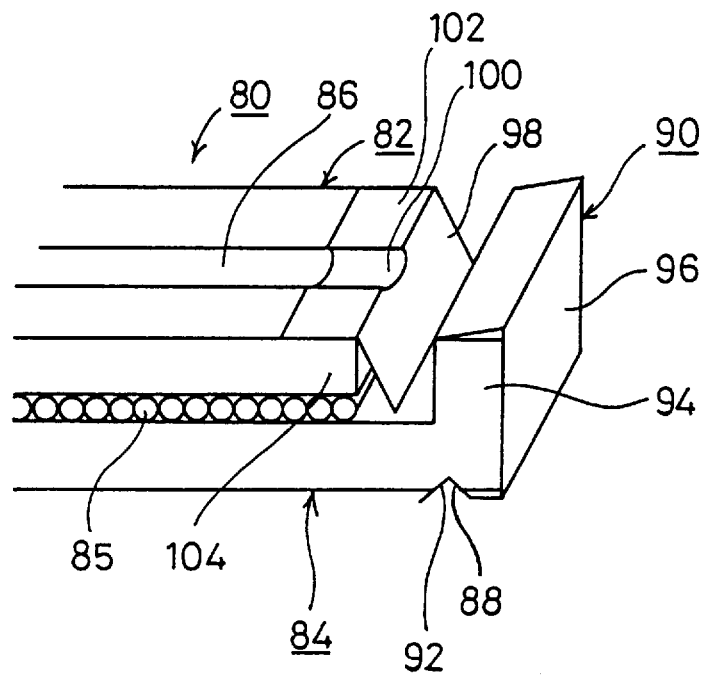
FIG. 8C is a partially broken perspective view of the electromagnetic noise absorber attached on a flat cable.

As shown in FIGS. 8A–8C, an electromagnetic noise absorber 80 is provided with a plate magnetic body 82 and a U-shaped magnetic body 84 in the same manner as the first embodiment. Different from the first embodiment, a positioning groove 86 having an arcuate cross section is formed in the upper surface of the plate magnetic body 82, and a V-shaped engagement groove 88 is formed in the lower end portion of the U-shaped magnetic body 84.

As aforementioned, in the second embodiment, a pair of fixing members 90, each formed integrally of an elastic sheet, are used. Each of the fixing members 90 is composed of an engaging portion 92 to be disengageably engaged in the engagement groove 88 of the U-shaped magnetic body 84, a substantially U-shaped portion 96 formed to fit the outer configuration of a side wall 94 of U-shaped magnetic body 84, a V-shaped portion 98 connected from the U-shaped portion 96, a presser portion 102 connected from the V-shaped portion 98, and a recessed portion 100 formed in the presser portion 102 to fit the configuration of the positioning groove 86 of the plate magnetic body 82.

In attachment of the electromagnetic noise absorber 80 around a flat cable 85 by means of the fixing members 90, as shown in FIG. 8C, the flat cable 85 is sandwiched between the plate magnetic body 82 and the U-shaped magnetic body 84. Subsequently, one of the fixing members 90 is attached to one end of the electromagnetic noise absorber 80: the U-shaped portion 96 is engaged with the side wall 94 of the U-shaped magnetic body 84, the engaging portion 92 is engaged in the engagement groove 88, the V-shaped portion 98 is inserted between an end portion 104 of plate magnetic body 82 and the side wall 94 of U-shaped magnetic body 84, the recessed portion 100 is engaged in the positioning groove 86 and the presser portion 102 is attached to the upper surface of the end portion 104 of the plate magnetic body 82. Finally, the other fixing member 90 is attached to the other end (not shown) of the electromagnetic noise absorber 80.

The elastic force exerted when the fixing members 90 are elastically deformed causes the plate magnetic body 82 and the U-shaped magnetic body 84 to be pulled toward each other. Therefore, the flat cable 85 is held between the plate magnetic body 82 and the U-shaped magnetic body 84, and the electromagnetic noise absorber 80 is attached around the flat cable 85.

Since the pair of fixing members 90 are identical, the same clearance is formed by the V-shaped portions 98 between the plate magnetic body 82 and the U-shaped magnetic body 84 at each end of the electromagnetic noise absorber 80.

THIRD EMBODIMENT

Figure 9:
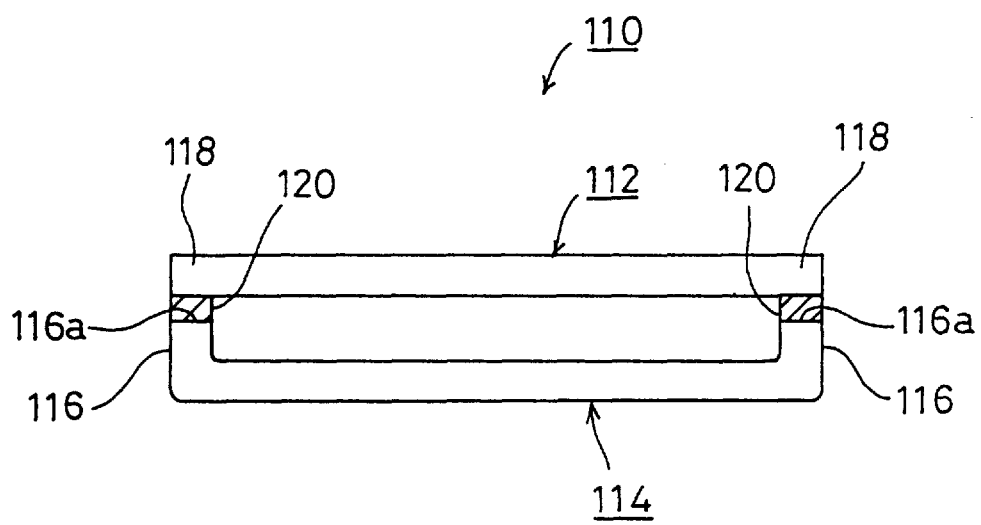
FIG. 9 is a sectional view of an electromagnetic noise absorber according to the third embodiment.

As shown in FIG. 9, also in the third embodiment, an electromagnetic noise absorber 110 is provided with a plate magnetic body 112 and a U-shaped magnetic body 114. Different from the other embodiments, the width of the plate magnetic body 112 is greater than the interval between side walls 116 of U-shaped magnetic body 114. When the electromagnetic noise absorber 110 is attached to a flat cable (not shown), a pair of spacers 120 are used. Each of the spacers 120 is disposed between an upper end 116a of side wall 116 of U-shaped magnetic body 114 and the underside of end portion 118 of plate magnetic body 112. Since the spacers 120 have the same thickness, the same interval can be provided between the U-shaped magnetic body 114 and the plate magnetic body 112 at each end of the electromagnetic noise absorber 110.

FOURTH EMBODIMENT

Figure 10:
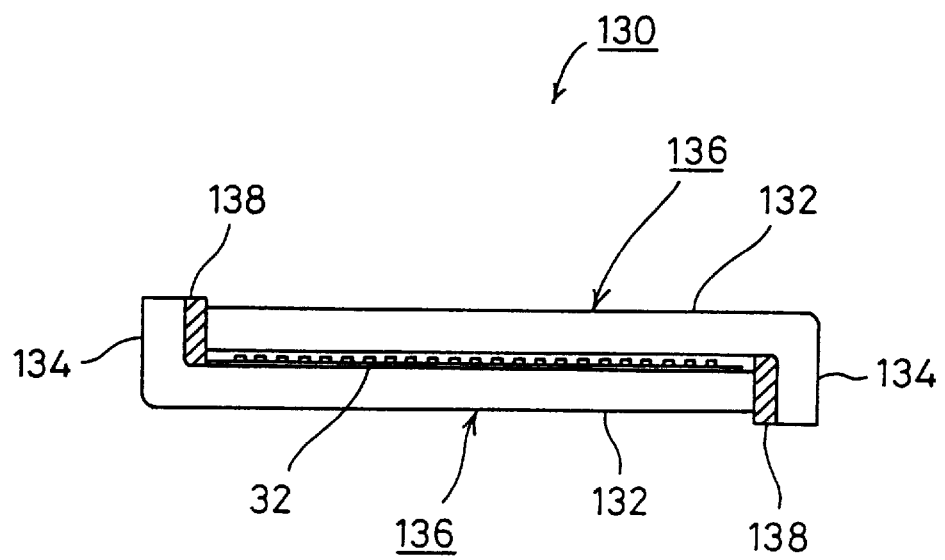
FIG. 10 is a sectional view of an electromagnetic noise absorber according to the fourth embodiment.
Figure 11A:
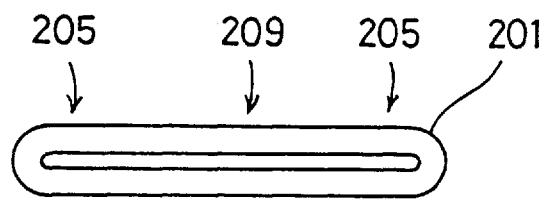
FIG. 11A is a sectional view of a prior-art electromagnetic noise absorber integrally formed.
Figure 11B:
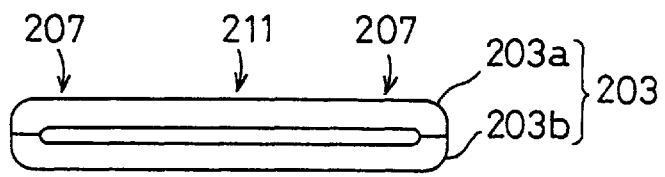
FIG. 11B is a sectional view of a prior-art electromagnetic noise absorber formed of divided bodies.

As shown in FIG. 10, in the fourth embodiment, an electromagnetic noise absorber 130 is provided with a pair of L-shaped magnetic bodies 136. Each of the L-shaped magnetic bodies 136 is composed of a plate portion 132 and a side wall 134 extended vertically from the plate portion 132.

When the electromagnetic noise absorber 130 is attached to the FPC cable 32, as shown in FIG. 10, the L-shaped magnetic bodies 136 are assembled such that one L-shaped magnetic body 136 is turned over 180 degrees relative to the other L-shaped magnetic body 136. The FPC cable 32 is held between the plate portions 132 of the upper and lower L-shaped magnetic bodies 136. In this case, adhesive double coated tapes are placed between the upper plate portion 132 and the FPC cable 32 and between the FPC cable 32 and the lower plate portion 132, respectively, thereby interconnecting these three components in the same manner as shown in FIG. 1B. Additionally, a pair of spacers 138 are provided between the plate portions 132 of the upper and lower L-shaped magnetic bodies 136 and the side walls 134 of the lower and upper L-shaped magnetic bodies 136, respectively. Since the spacers 138 have the same thickness, the same interval is made between the upper and lower magnetic bodies 136 at each end of the electric magnetic body 130.

In the same manner as in the other embodiments, in the electromagnetic noise absorber 130, the impedance at both end portions is different only slightly from the impedance at the middle portion. Therefore, the electromagnetic noise eliminating effect of the electromagnetic noise absorber 130 varies only slightly with the signal conductors arranged in the FPC cable 32.

As aforementioned, according to the present invention, there is only a small difference in impedance and, therefore, in electromagnetic noise eliminating effect, with the positions of the electric wires juxtaposed in the flat cable to which the electromagnetic noise absorber is attached.

When the electromagnetic noise absorber is attached to the flat cable, a clearance is easily obtained by providing a spacing member between the assembled magnetic bodies.

This invention has been described above with reference to the preferred embodiments as shown in the figures. Modifications and alterations may become apparent to one skilled in the art upon reading and understanding the specification. Despite the use of embodiments for illustration purposes, the invention is intended to include all such modifications and alterations within the spirit and scope of the appended claims.

What is claimed is:

1. An electromagnetic noise absorber comprising:

a first magnetic body having a plate member with two integrated side walls, the first magnetic body thereby having a flattened U-shaped cross section; and a second, plate-shaped magnetic body having two end portions;

whereby the first and second magnetic bodies combine to form a structure wherein the plate member of the first magnetic body and the second, plate-shaped magnetic body are parallel and there is a clearance between the side walls and the end portions of the second magnetic body, whereby extending through the absorber between the bodies is absorbed electrical noise in a cable and containing at least one signal conductor.

2. An electromagnetic noise absorber as in claim 1, wherein at least one spacer member is provided for maintaining, at a predetermined distance, the clearance formed between the side walls and the end portions of the second, plate-shaped magnetic body.

3. An electromagnetic noise absorber as in claim 2, wherein the spacers are fabricated from materials selected from the group consisting of sponge, rubber, felt, cork or other elastic material, plastic material, and electrical insulating material.

4. An electromagnetic noise absorber as in claim 1, wherein the first and second magnetic bodies enclose the body containing at least one signal conductor and the absorber is held together with a latching mechanism.

5. An electromagnetic noise absorber as in claim 1, wherein at least one adhesive layer is provided on the second, plate-shaped magnetic body and on the plate member of the first magnetic body, the at least one adhesive layer maintaining the cable, containing at least one signal conductor, in place.

6. An electromagnetic noise absorber as in claim 1, wherein the first and second magnetic bodies are made of ferrite.

7. An electromagnetic noise absorber attached to the outer periphery of a flat body with a plurality of signal conductors juxtaposed therein, comprising:

a first magnetic body having a first plate member;

a second magnetic body having a second plate member; and at least two side walls projected from end portions of at least one plate member, such that when said electromagnetic noise absorber is attached to said flat body, with said first plate member opposed to one face of said flat body and said second plate member opposed to the other face of said flat body, a clearance is made between said side walls and the end portions having no side walls of said first plate member or said second plate member.

8. An electromagnetic noise absorber according to claim 7, further comprising a spacer member for retaining said clearance when said electromagnetic noise absorber is attached to said flat body.

9. An electromagnetic noise absorber as in claim 8, wherein the spacers are fabricated from materials selected from the group consisting of sponge, rubber, felt, cork or other elastic material, plastic material, and electrical insulating material.

10. An electromagnetic noise absorber according to claim 7, wherein at least one adhesive layer is provided on each, plate member, such that the adhesive layer fixes in place the body containing at least one signal conductor.

11. An electromagnetic noise absorber according to claim 7, wherein the first and second magnetic bodies enclose the body with a plurality of signal conductors and the absorber is held together with a latching mechanism.

12. An electromagnetic noise absorber as in claim 7, wherein the first magnetic body is in the shape of a flat plate and the second magnetic body has a U-shaped cross section.

13. An electromagnetic noise absorber as in claim 7, wherein the first and second magnetic bodies have L-shaped cross sections.

14. An electromagnetic noise absorber as in claim 7, wherein the first and second magnetic bodies are made of ferrite.

15. An electromagnetic noise absorber comprising:
 a first magnetic body having a plate member with an end portion and an integrated side wall, the first magnetic body thereby having a substantially L-shaped cross section; and
 a second magnetic body having a plate member with an end portion and an integrated side wall, the second magnetic body thereby having a substantially L-shaped cross section;
 whereby the first and second magnetic bodies combine to form a structure wherein the plate members and side walls are disposed to form a rectangular box structure with a clearance between the side wall of each magnetic body and the plate member end portion of the other magnetic body, whereby a cable containing at least one signal conductor is substantially encompassed by the structure to absorb electrical noise.

16. The electromagnetic noise absorber of claim 15 wherein at least one spacer member is provided for maintaining a desired clearance formed between the side walls and the end portions.

17. The electromagnetic noise absorber of claim 15 wherein an adhesive layer is provided on each plate member, the at least one adhesive layer maintaining in place the cable containing at least one signal conductor.

18. The electromagnetic noise absorber of claim 15 wherein the first and second magnetic bodies enclose the cable containing at least one signal conductor and the absorber is held together with a latching mechanism.

19. The electromagnetic noise absorber of claim 15 wherein the first and second magnetic bodies are made of ferrite.

* * * * *